United States Patent [19]

Wakui

[11] Patent Number: 5,526,434

[45] Date of Patent: Jun. 11, 1996

[54] AUDIO SIGNAL OUTPUT DEVICE

[75] Inventor: Tetsuya Wakui, Chiba-ken, Japan

[73] Assignee: Canon Kabushiki Kaisha, Tokyo, Japan

[21] Appl. No.: 309,551

[22] Filed: Sep. 20, 1994

Related U.S. Application Data

[63] Continuation of Ser. No. 975,679, Nov. 13, 1992, abandoned.

[30] Foreign Application Priority Data

Nov. 29, 1991 [JP] Japan ................................ 3-316475

[51] Int. Cl.⁶ ................................................ H04B 15/00
[52] U.S. Cl. ............................. 381/94; 381/123; 381/85
[58] Field of Search ........................... 330/51; 381/123, 381/85; 455/212, 218, 221

[56] References Cited

U.S. PATENT DOCUMENTS 3,944,941  3/1976  Tsuda ........................................ 381/24
4,439,693  3/1984  Lucas et al. ............................... 330/51

*Primary Examiner*—Curtis Kuntz
*Assistant Examiner*—Ping W. Lee
*Attorney, Agent, or Firm*—Robin, Blecker, Daley & Driscoll

[57] ABSTRACT

In an audio signal output device, when muting audio signals outputted from audio signal output terminals, a ground terminal provided for the audio signal output terminals is brought into an open state in association with the muting action, so that the audio signals can be adequately muted without causing any noise or the like.

5 Claims, 2 Drawing Sheets

5,526,434

AUDIO SIGNAL OUTPUT DEVICE

This is a continuation application under 37 CFR 1.62 of prior application Ser. No. 07/975,679, filed Nov. 13, 1992, now abandoned.

BACKGROUND OF THE INVENTION

1. Field of the Invention

This invention relates to an audio signal output device, and more particularly to an audio signal output device having audio signal output terminals of a plurality of channels and a common terminal provided therefor.

2. Description of the Related Art

The audio signal output devices of this kind include, for example, a stereo output device which is disposed on the output side of a video tape recorder (VTR) or an audio tape recorder.

In the devices of this kind in general, noises are generated when a reproduced output is in an unstable state or when the mode of operation of the recorder changes. To solve this problem, practice has been to mute such noises by causing a short circuit between each audio signal output terminal and a common terminal (common line) by means of a semiconductor switch or the like.

However, in the case of such a device, the semiconductor switch actually gives some on-state resistance when a short circuit between the audio signal output terminal and the common terminal is caused by turning on the semiconductor switch for the purpose of muting. Hence, the amount of output-signal attenuation attainable by carrying out the muting is determined by a ratio between a load connected to each output terminal, such as the impedance of a speaker or a headphone, and the above-stated on-state resistance of the semiconductor switch.

Where a sufficient amount of attenuation of the output is not attainable at the time of muting with the on-state resistance of the semiconductor switch being excessively large, it has been impossible to sufficiently subdue the noises generated within the recorder.

SUMMARY OF THE INVENTION

It is a general object of this invention to provide an audio signal output device which is arranged to be capable of solving the above-stated problem.

It is a more specific object of this invention to provide an audio signal output device which is arranged to be capable of adequately performing muting on an audio signal.

Under this object, an audio signal output device arranged according to this invention to output an audio signal comprises: an audio signal output terminal for outputting an audio signal; a ground terminal provided for the audio signal output terminal; a first circuit connected to the audio signal output terminal and arranged to perform a muting action on the audio signal outputted from the audio signal output terminal; and a second circuit arranged to bring the ground terminal into an open state in association with the muting action of the first circuit.

It is another object of this invention to provide an audio signal output device arranged to be capable of adequately performing muting on a plurality of kinds of audio signals.

Under that object, an audio signal output device arranged according to this invention to output audio signals comprises: a plurality of audio signal output terminals for outputting audio signals of a plurality of channels; a ground terminal provided in common for the plurality of audio signal output terminals; a first circuit connected to the plurality of audio signal output terminals and arranged to perform a muting action on each of the audio signals outputted from the plurality of audio signal output terminals; and a second circuit arranged to bring the ground terminal into an open state in association with the muting action of the first circuit.

The above and other objects and features of this invention will become apparent from the following detailed description of an embodiment thereof taken in connection with the accompanying drawings.

DETAILED DESCRIPTION OF THE PREFERRED EMBODIMENT

Figure 2:
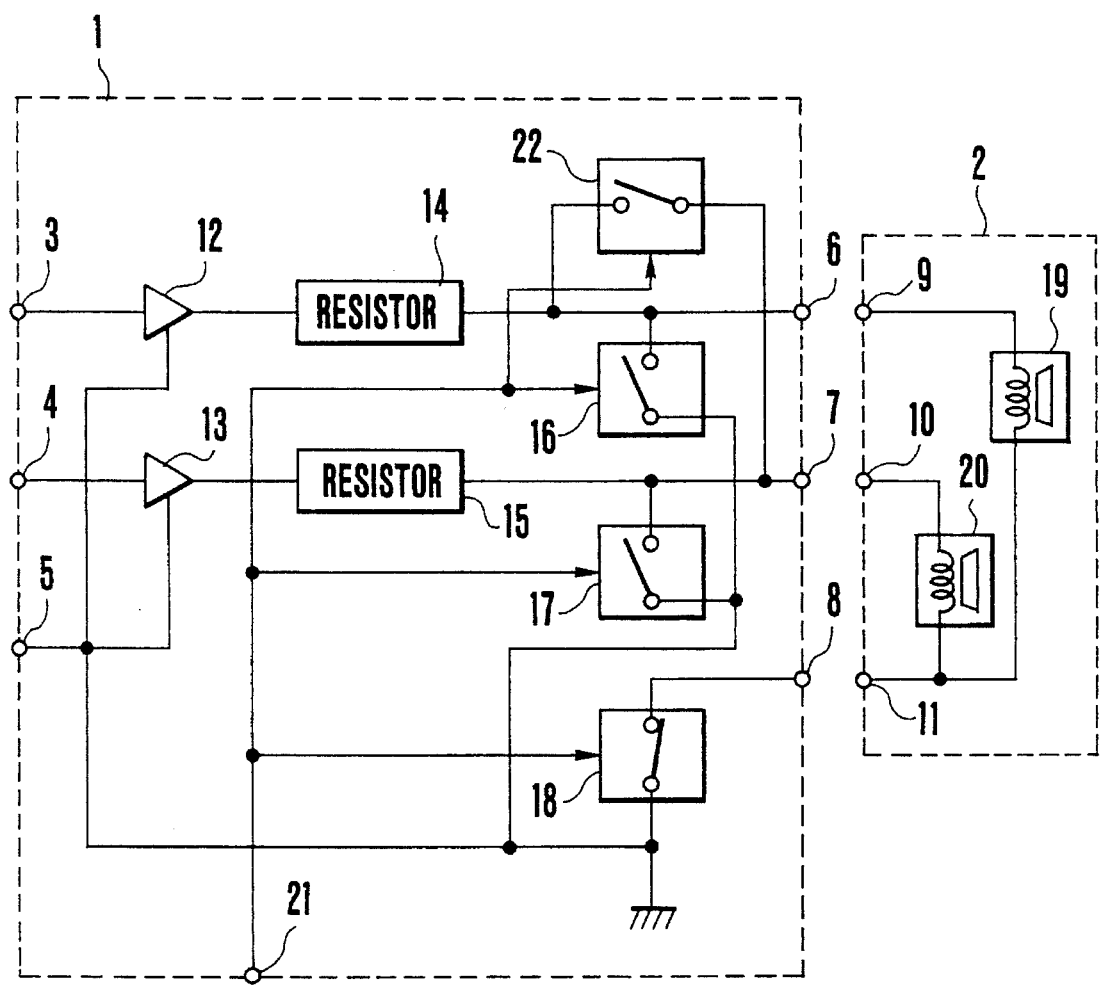
FIG. 2 is a block diagram showing the arrangement of a sound output system including an audio signal output device which is arranged according to this invention as an embodiment thereof.

An embodiment of this invention is described below with reference to the accompanying drawings:

FIG. 2 is a block diagram showing a sound output system including an audio signal output device arranged according to this invention as an embodiment thereof. In FIG. 2, reference numeral 1 denotes the audio signal output device. A load device 2 is connected to the audio signal output device 1. Audio signal input terminals 3 and 4 are provided for inputting audio signals to the audio signal output device 1. A common terminal 5 which is disposed on the input side of the audio signal output device 1 is normally grounded.

The sound output system further includes audio signal output terminals 6 and 7, a common terminal 8 disposed on the output side of the audio signal output device 1, input terminals 9 and 10 disposed on the side of the load device 2, and a common terminal 11 disposed also on the side of the load device 2.

Output amplifiers 12 and 13 are disposed within the audio signal output device 1. Output resistors 14 and 15 are provided respectively for the output amplifiers 12 and 13. Switching circuits 16 and 17 are provided for muting. A switching circuit 18 is provided for opening the common terminal 8. Loads 19 and 20 disposed within the load device 2 are, for example, speaker vibrators or headphone vibrators which are arranged to convert currents into sound waves. A control terminal 21 is arranged to receive signals for controlling the on/off actions of the switching circuits 16 and 17 for muting, those of the switching circuit 18 provided for opening the common terminal 8 and those of another switching circuit 22. The switching circuit 22 is arranged to cause a short circuit between the above-stated audio signal output terminals 6 and 7 of two channels.

With the sound output system arranged as described above, a normal audio-signal outputting operation of the system is performed as follows. In the normal audio-signal outputting operation, the signal inputted to the control terminal 21 causes the switching circuits 16 and 17 to turn off. Audio signals amplified by the output amplifiers 12 and 13 are then outputted respectively from the output terminals 6 and 7.

Meanwhile, at this time, the switching circuit 18 is in an on-state. With the load device 2 connected to the audio signal output device 1, the output signals from the output terminals 6 and 7 flow as currents respectively through a path consisting of the input terminal 9—the load 19—the common terminal 11—the common terminal 8—the switching circuit 18 and a path consisting of the input terminal 10—the load 20—the common terminal 11—the common terminal 8—the switching circuit 18. The currents flowing through the loads 19 and 20 are then converted into sounds.

In muting the output signal, the system operates as follows. In this case, a control signal coming through the control terminal 21 causes the switching circuits 16 and 17 to turn on. The audio signal output terminals 6 and 7 are then grounded to mute the output signals coming from the audio signal output terminals 6 and 7.

However, the attenuation ratio of muting is not an infinity value, because the on-state resistance of the switching circuits 16 and 17 is not zero as mentioned in the foregoing. Therefore, there arise residual voltage waveforms at the output terminals 6 and 7.

Meanwhile, since the switching circuit 22 is caused to turn on at this time, the residual voltage waveforms arising at the output terminals 6 and 7 become almost the same. Further, since the switching circuit 18 is caused to be in an open state at this time, almost no current flows to the loads 19 and 20.

Figure 3:
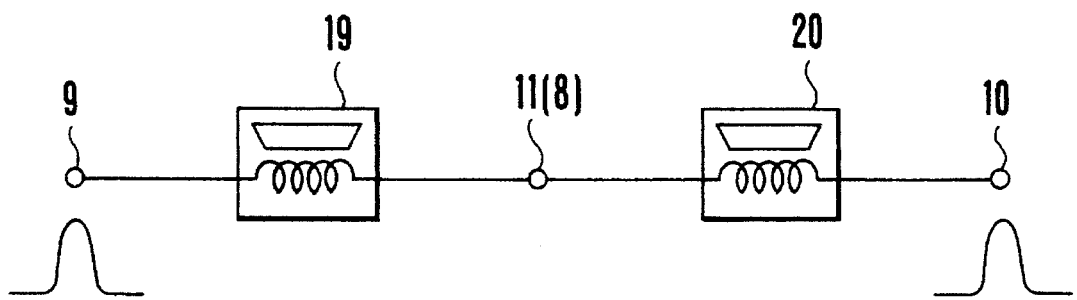
FIG. 3 is a schematic representation showing the sound output system of FIG. 2 in a state where muting is performed.

This condition is described as follows with reference to FIGS. 3 and 1. FIG. 3 schematically shows the system of FIG. 2 in a state where the muting action is performed. As apparent from FIG. 3, almost no current flows to the loads 19 and 20 when the same voltage is applied to the input terminals 9 and 10 of the load device 2.

Figure 1:
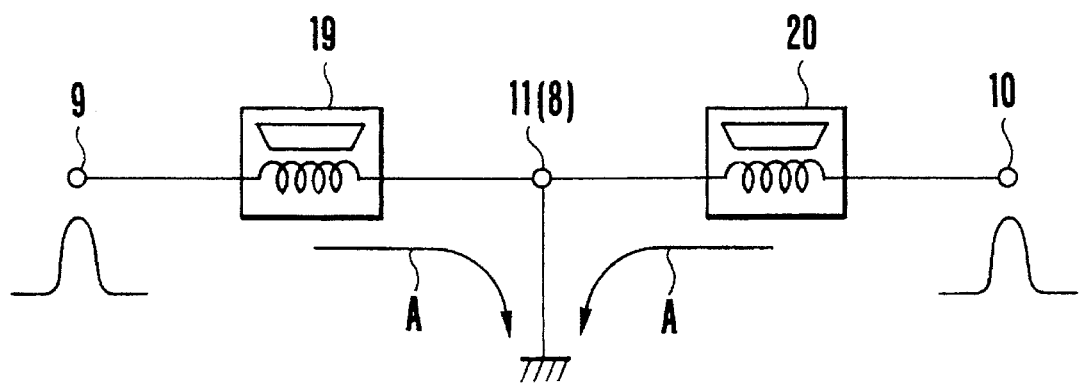
FIG. 1 is a schematic representation showing a conventional sound output system in a state where muting is performed.

FIG. 1 schematically shows the conventional system in a state where the common terminal 11 is grounded. In the case of the conventional system, as apparent from the drawing, voltages generated at the terminals 9 and 10 cause currents A to flow.

In the system of the embodiment described above, even if the on-state resistance of the switching circuits 16 and 17 is not of a negligible value, almost no current flows to the loads 19 and 20 at the time of muting. Therefore, almost no noise arises when muting is performed.

Further, in the embodiment described above, the switching circuit 22 is arranged to cause, at the time of muting, a short circuit between the output terminals 6 and 7 of the respective audio channels so as to enhance the advantageous effect produced by opening the common terminal 8. However, depending on the characteristic of the noise arising, the advantageous effect can be sufficiently attained without the switching circuit 22, in actually carrying out the muting action.

With the audio signal output device of this embodiment arranged as described in the foregoing, in performing a muting action by means of the switching circuit, the signals outputted from the audio signal output terminals can be sufficiently attenuated to ensure adequate muting.

What is claimed is:

1. An audio signal output device for outputting an audio signal input thereto to an audible reproducing unit or for muting the input audio signal, comprising:

a) a ground terminal for connecting to ground either a first terminal or a second terminal of an audio signal output side of said device; and b) connecting circuit means for
      (1) connecting the first terminal of said audio signal output side to the reproducing unit and connecting the second terminal of said audio signal output side to said ground terminal, when muting is not being performed, and
      (2) connecting the first terminal of said audio signal output side to said ground terminal and to place the second terminal of said audio signal output side in an electrically open state, when muting is being performed.

2. A device according to claim 1, wherein said audio signal output device comprises an amplifying circuit for amplifying the input audio signal and supplying the amplified input audio signal to the first terminal of said audio signal output side.

3. An audio signal output device for outputting audio signals input thereto to an audible reproducing unit or for muting the input audio signals, comprising:

a) a ground terminal for connecting to ground either first terminals or a second terminal of an audio signal output side of said device, said first terminals being terminals of respective first and second channels of said device, said second terminal being a terminal common to said first and second channels; and b) connecting circuit means for
      (1) connecting the first terminals of said audio signal output side to the reproducing unit and connecting the second terminal of said audio signal output side to said ground terminal, when muting is not being performed, and
      (2) connecting the first terminals of said audio signal output side to said ground terminal and to place the second terminal of said audio signal output side in an electrically open state, when muting is being performed.

4. A device according to claim 3, wherein said connection circuit connects said first terminals to one another when muting is being performed.

5. A device according to claim 3, wherein said audio signal output device comprises an amplifying circuit for amplifying respectively the plurality of input audio signals and supplying the amplified input audio signals respectively to said first terminals.

* * * * *

UNITED STATES PATENT AND TRADEMARK OFFICE
CERTIFICATE OF CORRECTION

PATENT NO. : 5,526,434
DATED : June 11, 1996
INVENTOR(S) : Tetsuya Wakui

It is certified that error appears in the above-indentified patent and that said Letters Patent is hereby corrected as shown below:

On the title page, Item [54], After "DEVICE" insert -- HAVING MUTED FUNCTION --.

Col. 1, line 1, after "DEVICE" insert -- HAVING MUTED FUNCTION --.

Col. 2, line 32, Change":" to -- . --.

Signed and Sealed this

Seventh Day of January, 1997

Attest:

BRUCE LEHMAN

*Attesting Officer*  *Commissioner of Patents and Trademarks*